(12) United States Patent
Liu (10) Patent No.: US 10,298,180 B2
(45) Date of Patent: May 21, 2019

(54) CONTROL CIRCUIT, CONTROL METHOD, AND ELECTRONIC DEVICE

(71) Applicants: BOE TECHNOLOGY GROUP CO., LTD., Beijing (CN); K-TRONICS (SUZHOU) TECHNOLOGY CO., LTD., Suzhou, Jiangsu (CN)

(72) Inventor: Songlin Liu, Beijing (CN)

(73) Assignees: BOE TECHNOLOGY GROUP CO., LTD., Beijing (CN); K-TRONICS (SUZHOU) TECHNOLOGY CO., LTD., Suzhou, Jiangsu (CN)

( * ) Notice: Subject to any disclaimer, the term of this patent is extended or adjusted under 35 U.S.C. 154(b) by 0 days.

(21) Appl. No.: 15/566,370

(22) PCT Filed: May 5, 2017

(86) PCT No.: PCT/CN2017/083206
§ 371 (c)(1),
(2) Date: Oct. 13, 2017

(87) PCT Pub. No.: WO2018/045770
PCT Pub. Date: Mar. 15, 2018

(65) Prior Publication Data
US 2018/0302043 A1    Oct. 18, 2018

(30) Foreign Application Priority Data

Sep. 12, 2016  (CN) .......................... 2016 1 0816674

(51) Int. Cl.
*H03F 3/72*      (2006.01)
*H03F 1/26*      (2006.01)
(Continued)

(52) U.S. Cl.
CPC ............... *H03F 1/26* (2013.01); *G06F 3/147* (2013.01); *G09G 5/003* (2013.01); *H03F 1/303* (2013.01);
(Continued)

(58) Field of Classification Search
CPC .................................... H03F 1/14; H03F 3/72
(Continued)

(56) References Cited

U.S. PATENT DOCUMENTS 5,939,938 A * 8/1999 Kalb ....................... H03F 1/305
                                                         330/110
2008/0137882 A1 6/2008 Tsai et al.
(Continued)

FOREIGN PATENT DOCUMENTS

CN       101087130 A      12/2007
CN       101174824 A       5/2008
(Continued)

OTHER PUBLICATIONS

International Search Report and Written Opinion dated Jul. 28, 2017; PCT/CN2017/083206.

*Primary Examiner* — Steven J Mottola
(74) *Attorney, Agent, or Firm* — Ladas & Parry LLP (57) ABSTRACT

This application provides a control circuit, a control method, and an electronic device the control circuit comprising: a first control sub-circuit configured to receive a first power supply signal from a first power supply sub-circuit in an electronic device that includes the control circuit and output a first control signal; a second control sub-circuit configured to receive a second power supply signal from a second power supply sub-circuit in the electronic device and output a second control signal under control of the first control signal, wherein the second control signal is used to control a functional sub-circuit in the electronic device to be dis-
(Continued)

abled during power-on and power-off process of the electronic device.

12 Claims, 6 Drawing Sheets (51) Int. Cl.
G09G 5/00 (2006.01)
H03F 3/213 (2006.01)
G06F 3/147 (2006.01)
H03F 1/30 (2006.01)
H03F 3/24 (2006.01)

(52) U.S. Cl.
CPC ............ *H03F 3/213* (2013.01); *H03F 3/245* (2013.01); *H03F 3/72* (2013.01); *G09G 2330/02* (2013.01); *G09G 2330/026* (2013.01); *G09G 2330/027* (2013.01); *H03F 2200/372* (2013.01); *H03F 2200/516* (2013.01)

(58) Field of Classification Search
USPC .......................................... 330/51; 381/94.5
See application file for complete search history.

(56) References Cited

U.S. PATENT DOCUMENTS

2008/0159562 A1 7/2008 Liu et al.
2009/0121785 A1 5/2009 Liu et al.

FOREIGN PATENT DOCUMENTS

| CN | 101202534 A | 6/2008 |
| CN | 101211208 A | 7/2008 |
| CN | 201153249 Y | 11/2008 |
| CN | 101499776 A | 8/2009 |
| CN | 202172391 U | 3/2012 |
| CN | 206020961 U | 3/2017 |

* cited by examiner

| Sctr2 | Sset | Functional unit |
|---|---|---|
| L | L | Enabled |
| L | H | Disabled |
| H | x | Disabled |

CONTROL CIRCUIT, CONTROL METHOD, AND ELECTRONIC DEVICE

TECHNICAL FIELD

The present application relates to a control circuit, a control method, and an electronic device.

BACKGROUND

At present, a power amplifier integrated circuit (IC) module is typically built in a display device such as a display, a television set or the like, so that an audio output can be provided in the display device. However, during power-on and power-off process of the display device equipped with the power amplifier IC, because the power amplifier IC is provided with a voltage to continue to operate, it will lead to puffing noise during the power-on and power-off process.

For this reason, it is desirable to provide a control circuit, a control method, and a display device which can completely avoid the puffing noise problem during the power-on and power-off process, thereby improve user experience.

SUMMARY

According to an embodiment of the present application, there is provided a control circuit, the control circuit comprising:

a first control sub-circuit configured to receive a first power supply signal from a first power supply sub-circuit in an electronic device that includes the control circuit and output a first control signal;

a second control sub-circuit configured to receive a second power supply signal from a second power supply sub-circuit in the electronic device and output a second control signal under control of the first control signal, wherein the second control signal is used to control a functional sub-circuit in the electronic device to be disabled during power-on and power-off process of the electronic device.

Optionally, the functional sub-circuit is a power amplifier sub-circuit, when the second control signal is at a first voltage level, the power amplifier sub-circuit is disabled; and when the second control signal is at a second voltage level, the power amplified is enabled.

Optionally, the second power supply signal is different from the first power supply signal, and the second power supply signal is obtained by converting the first power supply signal.

Optionally, the control circuit further comprises:

a third control sub-circuit configured to receive a third power supply signal from a third power supply sub-circuit in the electronic device and output a third control signal, wherein the first control sub-circuit outputs the first control signal under control of the third control signal.

Optionally, the first control sub-circuit comprises a first transistor, a drain of the first transistor is connected to the first power supply sub-circuit to receive the first power supply signal, a gate of the first transistor is connected to the third control sub-circuit to receive the third control signal, a source of the first transistor is grounded, and the first control signal is outputted at the drain of the first transistor, when the third control signal is at a first voltage level, a voltage level of the first control signal is the same as a voltage level of the first power supply signal; and when the third control signal is at a third voltage level, a voltage level of the first control signal is a first voltage level.

Optionally, the third control sub-circuit comprises a zener diode, a reverse terminal of the zener diode is connected to the third power supply signal and a forward terminal of the zener diode is connected to the gate of the first transistor to output the third control signal, during the power-on process of the electronic device and when the third power supply signal has not reached a predetermined value, the third control sub-circuit outputs the third control signal at a first voltage level; and when the power-on process of the electronic device ends and the third power supply signal has reached a predetermined value, the third control sub-circuit outputs the third control signal at a third voltage level.

Optionally, the second control sub-circuit comprises a second transistor, a gate of the second transistor receives the first control signal outputted from the first control sub-circuit, a drain of the second transistor receives the second power supply signal outputted from the second power supply sub-circuit, a source of the second transistor is grounded, and the second control signal is outputted at the drain of the second transistor, when the first control signal is at a first voltage level, a voltage level of the second control signal is the same as a voltage level of the second power supply signal; and when a voltage level of the first control signal is the same as a voltage level of the first power supply signal, a voltage level of the second control signal is a first voltage level.

Optionally, the control circuit further comprises:

a fourth control sub-circuit configured to receive a setting signal from the electronic device and control a voltage level of the second control signal according to the setting signal.

Optionally, the fourth control sub-circuit comprises a third transistor, a gate of the third transistor receives the setting signal, a drain of the third transistor receives the second control signal outputted from the second control sub-circuit, and a source of the third transistor is grounded, when the setting signal is at a low voltage, a voltage level of the second control signal is the same as a voltage level of the second power supply signal; and when the setting signal is at a high voltage level, a voltage level is the second control signal is a first voltage level.

According to another embodiment of the present application, there is provided a control method applied to a control circuit as described in the above embodiment, the control method comprising:

receiving a first power supply signal from a first power supply sub-circuit in an electronic device that includes the control circuit through a first control sub-circuit, and outputting the first control signal;

receiving a second power supply signal from a second power supply sub-circuit in the electronic device through a second control sub-circuit, and outputting a second control signal under control of the first control signal, wherein the second control signal is used to control a functional sub-circuit in the electronic device to be disabled during power-on and power-off process of the electronic device.

Optionally, the control method further comprises:

receiving a third power supply signal from a third power supply sub-circuit in the electronic device through a third control sub-circuit, and outputting a third control signal, wherein the first control sub-circuit outputs the first control signal under control of the third control signal, when the third control signal is at a first voltage level, a voltage level of the first control signal is the same as a voltage level of the first power supply signal; and when the third control signal is at a third voltage level, a voltage level of the first control signal is a first voltage level.

Optionally, the control method further comprises:

receiving a setting signal from the electronic device through a fourth control sub-circuit, and controlling a voltage level of the second control signal according to the setting signal, wherein when the setting signal is at a low voltage level, a voltage level of the second control signal is the same as a voltage level of the second power supply signal; and when the setting signal is at a high voltage level, a voltage level of the second control signal is a first voltage level.

According to yet another embodiment of the present application, there is provided an electronic device, comprising.

power supply sub-circuits configured to provide a first power supply signal, a second power supply signal, and a third power supply signal;

a functional sub-circuit configured to perform a first functional operation;

a control circuit according to any one of the above embodiments.

Therefore, the control circuit, the control method, and the display device according to the embodiments of the present application can totally avoid the puffing noise problem during the power-on and power-off process, thereby improve user experience.

DETAILED DESCRIPTION OF THE EMBODIMENTS

Hereinafter, the control circuit, the control method, and the display device according to the embodiments of the present application will be described in detail with reference to the accompanying drawings. The control circuit according to an embodiment of the present application may be applied to any electronic device as long as the electronic device includes a power amplifier sub-circuit. Examples of such electronic device may include display, television, smartphone, tablet PC, and the like.

First Embodiment

Figure 1:
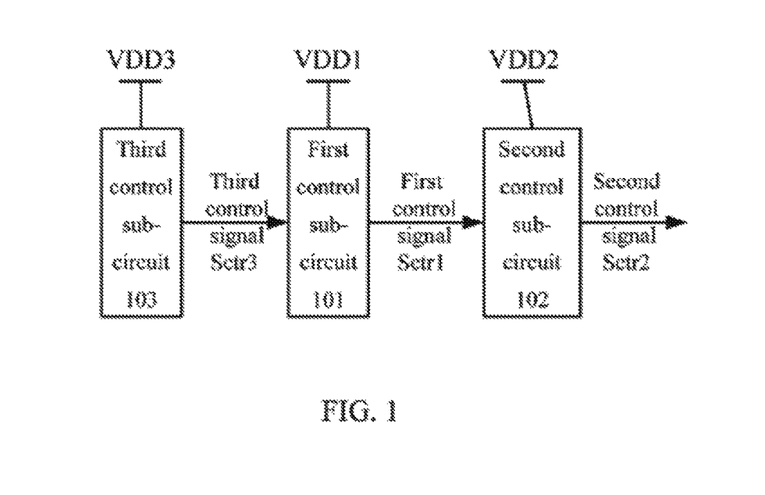
FIG. 1 is a block diagram illustrating configuration of a control circuit according to a first embodiment of the present application.

A control circuit according to a first embodiment of the present application will be described in detail below with reference to FIGS. 1 and 2. FIG. 1 is a block diagram illustrating configuration of a control circuit according to a first embodiment of the present application.

As shown in FIG. 1, the control circuit 100 according to the first embodiment of the present application comprises a first control sub-circuit 101, a second control sub-circuit 102, and a third control sub-circuit 103.

The first control sub-circuit 101 receives a first power supply signal VDD1 from a first power supply sub-circuit in the electronic device that includes the control circuit. The VDD1 is, for example, a 5V voltage in a power supply board of the electronic device, and can, for example, supply power to various circuit elements in the circuit board.

The first control sub-circuit 101 outputs a first control signal Sctr1 to the second control sub-circuit 102, for controlling signal output of the second control sub-circuit 102.

The second control sub-circuit 102 receives a second power supply signal VDD2 from a second power supply sub-circuit in the electronic device. The VDD2 is, for example, a 3.3V voltage in the power supply board of the electronic device, and can, for example, supply power to CPU and various integrated ICs such as Scalar IC in the electronic device.

The second control sub-circuit 102 can output a second control signal Sctr2 under control of the first control signal. The second control signal Sctr2 is used to control an operating state of a first functional sub-circuit in the electronic device, the first functional sub-circuit is, for example, a power amplifier sub-circuit included in the electronic device. It is to be noted that the first functional sub-circuit is not limited to the power amplifier sub-circuit. The first functional sub-circuit may also be, for example, camera, flash, antenna element or the like, depending on a different type of the electronic device.

The third control sub-circuit 103 receives a third power supply signal VDD3 from a third power supply sub-circuit in the electronic device. The VDD3 is, for example, a 12V voltage in the power supply board of the electronic device, the 12V voltage may also be, for example, a backlight driving voltage in the electronic device.

The third control sub-circuit 103 outputs a third control signal to the first control sub-circuit 101. The first control sub-circuit 101 outputs the first control signal under control of the third control signal.

According to this embodiment, in the case where the first functional sub-circuit is, for example, a power amplifier sub-circuit included in the electronic device, the second control signal may be made to be at a first voltage level, i.e., a low voltage level, during the power-on and power-off process of the electronic device.

Since the second control signal is connected to a control pin of the power amplifier sub-circuit of the electronic device, the power amplifier sub-circuit is disabled when the second control signal is at a low voltage level. On the other hand, the power amplifier sub-circuit is enabled when the second control signal is at a high voltage level.

Therefore, during the power-on and power-off process of the electronic device, the power amplifier sub-circuit can be disabled by controlling the second control signal to be at the first voltage level (i.e., the low voltage level). In this case, the electronic device does not produce puffing noise during the power-on and power-off process of the electronic device.

Next, specific circuit structure of the control circuit according to the first embodiment of the present application will be described in detail with reference to FIG. 2. FIG. 2 is a circuit diagram illustrating the control circuit according to the first embodiment of the present application.

Figure 2:
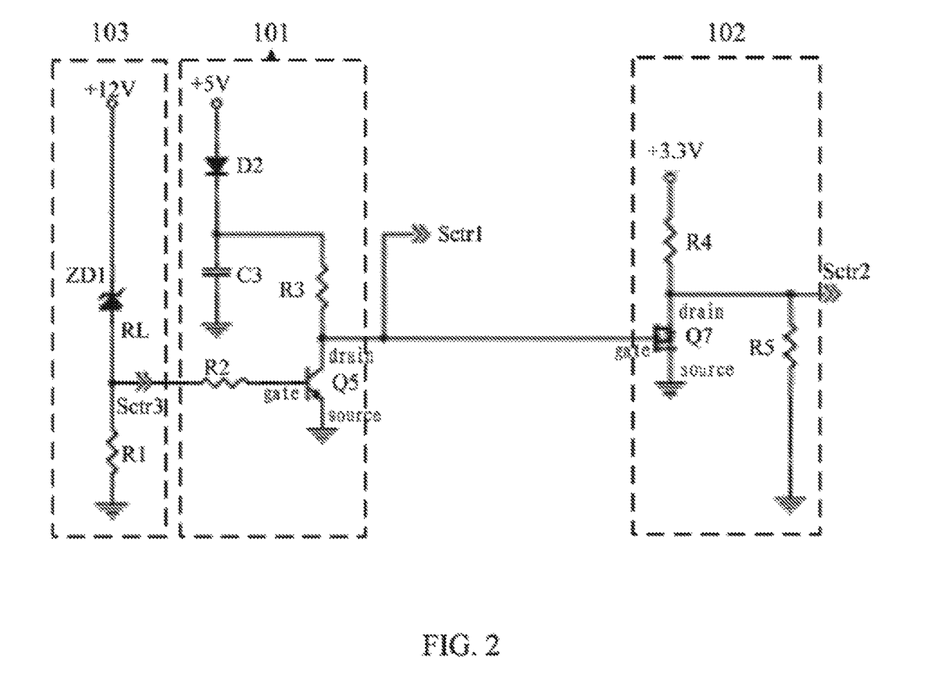
FIG. 2 is a circuit diagram illustrating the control circuit according to the first embodiment of the present application.

As shown in FIG. 2, the first control sub-circuit 101 comprises a first transistor Q5, a diode D2, a capacitor C3, and resistors R2 and R3. A drain of the first transistor Q5 is connected to the first power supply sub-circuit VDD1 of the electronic device to receive the first power supply signal (e.g., 5V voltage of the system). A gate of the first transistor Q5 is connected to the third control sub-circuit 103 to receive the third control signal. A source of the first transistor Q5 is grounded. The first control signal Sctr1 is outputted at the drain of the first transistor Q5.

The third control sub-circuit 103 comprises a zener diode ZD1, and a resistor R1. A reverse terminal of the zener diode ZD1 is connected to the third power supply signal VDD3 of the electronic device (e.g., 12V voltage of the system). A forward terminal of the zener diode ZD1 is connected to the gate of the first transistor Q5 to output the third control signal Sctr3.

The Zener diode ZD1 is used, for example, to provide a regulator signal equal to the third power supply signal, i.e., 12V. That is, when the third power supply signal has not reached 12V, the Zener diode ZD1 will not be turned on. In this case, the third control signal Sctr3 applied to the gate of the first transistor Q5 is at a low voltage level, i.e., 0V. On the other hand, when the third power supply signal has reached 12 V, the Zener diode ZD1 is punctured, thereby being turned on. In this case, the third control signal Sctr3 applied to the gate of the first transistor Q5 is at a high voltage level.

The second control sub-circuit 102 comprises a second transistor Q7, resistors R4 and R5. A gate of the second transistor Q7 receives the first control signal Sctr1 outputted from the first control sub-circuit 101. A drain of the second transistor Q7 receives the second power supply signal (e.g., 3.3V voltage of the system) outputted from the second power supply sub-circuit VDD2 of the electronic device. A source of the second transistor Q7 is grounded. The second control signal Sctr2 is outputted at the drain of the second transistor Q7.

When the third control signal Sctr3 is at a low voltage level, the first transistor Q5 is turned off. In this case, the voltage level of the first control signal Sctr1 is the same as the voltage level of the first power supply signal VDD1.

On the other hand, when the third control signal Sctr3 is at a high voltage level, the first transistor Q5 is turned on. In this case, the voltage level of the first control signal Sctr1 is a low voltage level.

In addition, when the first control signal Sctr1 is at a low voltage level, the second transistor Q7 is turned off. In this case, the voltage level of the second control signal Sctr2 is the same as the voltage level of the second power supply signal.

On the other hand, when the voltage level of the first control signal Sctr1 is equal to the voltage level of the first power supply signal, if the voltage of the first power supply signal is greater than a turn-on-voltage of the second transistor Q7, the second transistor Q7 is turned on, and in this case, the voltage level of the second control signal Sctr2 is a low voltage level.

Figure 3:
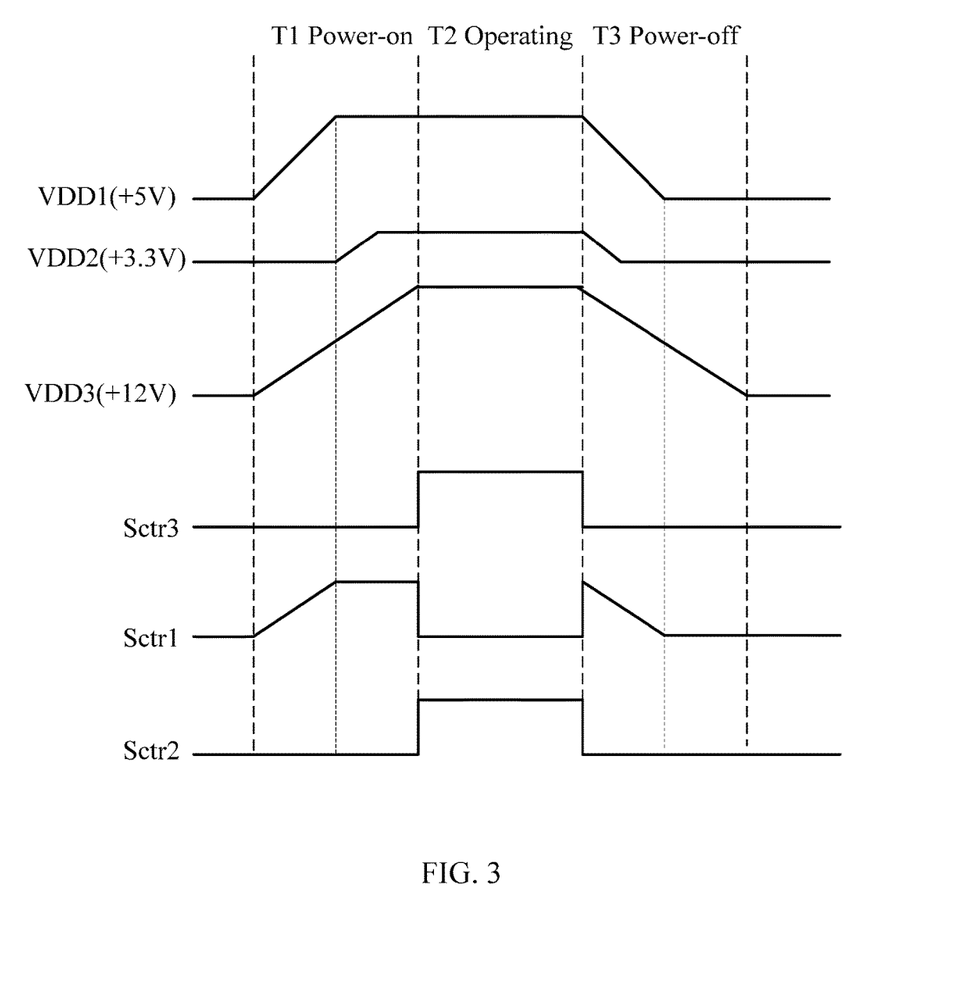
FIG. 3 is an operation timing diagram illustrating the control circuit according to the first embodiment of the present application.

Operations of the control circuit according to the embodiment of the present application will be described in detail below with reference to FIG. 3. FIG. 3 is an operation timing diagram illustrating the control circuit according to the first embodiment of the present application.

At the time of power-on, power sub-circuits of the electronic device start to operate, in this case, the first power supply signal VDD1 gradually increases from 0V to 5V, and the third power supply signal VDD3 gradually increases from 0V to 12V. It is to be noted that, in this embodiment, the second power supply signal VDD2 is obtained by converting the first power supply signal VDD1, thus as shown in FIG. 3, when the first power supply signal VDD1 has reached 5V, the second power supply signal VDD2 begins to gradually increase from 0V to 3.3V.

In addition, as shown in FIG. 3, when the third control signal Sctr3 is at a low voltage level, the voltage level of the first control signal Sctr1 is the same as the voltage level of the first power supply signal VDD1 and gradually increases from 0V to 5V and remains at 5V. In this case, since the first control signal Sctr1 is at a high voltage level, the second transistor Q7 is turned on, so the second control signal Sctr2 remains at a low voltage level.

Thereafter, as the third power supply signal VDD3 gradually increases from 0V to 12V, that is, when power-on is completed, the zener diode ZD1 is punctured, so the third control signal Sctr3 changes from a low voltage level to a high voltage level. At this timing, the first transistor Q5 is turned on, so the first control signal Sctr1 changes from a high voltage level to a low voltage level. Meanwhile, since the first control signal Sctr1 changes from a high voltage level to a low voltage level, the second transistor Q7 is turned off. In this case, the second control signal Sctr2 becomes a high voltage level, that is, the voltage value (e.g., 3.3V) of the second power supply signal VDD2.

It is to be noted that, setting the second power supply signal VDD2 to be obtained by converting the first power supply signal VDD1 in this embodiment of the present application has the function of causing the second power supply signal VDD2 to be delayed in comparison to the first power supply signal VDD1. Thereby it prevents the second control signal Sctr2 from outputting an erroneous control signal due to that the second transistor Q7 is turned off when the voltage of the first power supply signal VDD1 is relatively low.

Therefore, as can be seen from FIG. 3, since the voltage level of the second control signal Sctr2 for controlling the functional sub-circuit, such as the power amplifier sub-circuit, is kept at a low voltage level during a period T1 in which the electronic device is powered on, the first functional sub-circuit, such as the power amplifier sub-circuit, is disabled, which can completely avoid the puffing noise problem during the power-on process.

In addition, as shown in FIG. 3, since the voltage level of the second control signal Sctr2 is kept at a high voltage level during an operation period T2, the first functional sub-circuit, such as the power amplifier sub-circuit, is enabled.

Finally, when power supply sub-circuits of the electronic device stope working at the time of power-off, the first power supply signal VDD1 gradually decreases from 5V to 0V, the second power supply signal VDD2 gradually decreases from 3.3V to 0V, and the third power supply signal VDD3 gradually decreases from 12V to 0V.

Since the regulator voltage of the Zener diode ZD1 is 12V, the Zener diode ZD1 is turned off at a timing when the third power supply signal VDD3 decreases from 12V. In this case, the third control signal Sctr3 changes from a high voltage level to a low voltage level.

Meanwhile, since the third control signal Sctr3 changes from a high voltage level to a low voltage level, the first transistor Q5 is turned off. In this case, the first control signal Sctr1 becomes to be at the same voltage level as that of the first power supply signal VDD1 and gradually decreases from the high voltage level 5V to 0V.

Meanwhile, since the first control signal Sctr1 changes into a high voltage level, the second transistor Q7 is turned on. Therefore, the second control signal Sctr2 changes into a low voltage level and is kept until the power-off period T3 ends.

Therefore, it can be seen from FIG. 3 that, since the voltage level of the second control signal Sctr2 for controlling the functional sub-circuit, such as the amplifier sub-circuit, is kept at a low voltage level during the power-off period T3 of the electronic device, the first functional sub-circuit, such as the power amplifier sub-circuit, is disabled, which can completely avoid the puffing noise problem during the power-on process.

Consequently, the control circuit according to the first embodiment of the present application can completely avoid the puffing noise problem during the power-on and the power-off process, thereby improve user experience.

Second Embodiment

Figure 4:
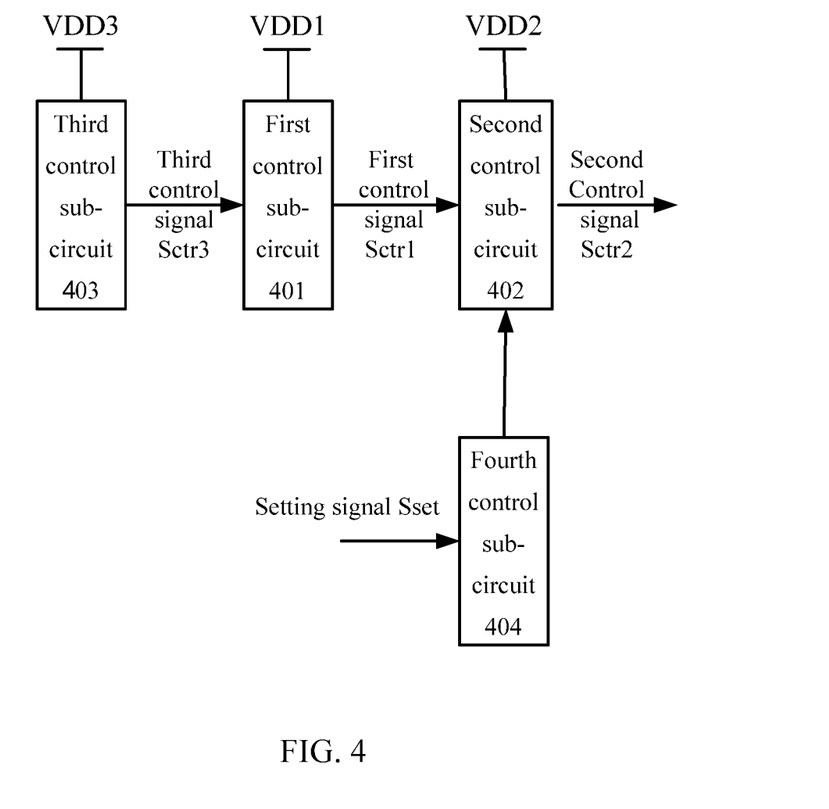
FIG. 4 is a block diagram illustrating configuration of a control circuit according to a second embodiment of the present application.

Hereinafter, a control circuit according to a second embodiment of the present invention will be described in detail with reference to FIGS. 4 and 5. FIG. 4 is a block diagram illustrating configuration of a control circuit according to a second embodiment of the present application.

As shown in FIG. 4, the control circuit 400 according to the second embodiment of the present application comprises a first control sub-circuit 401, a second control sub-circuit 402, a third control sub-circuit 403, and a fourth control sub-circuit 404.

In comparison to the control circuit 100 according to the first embodiment, the control circuit 100 according to the second embodiment has the fourth control sub-circuit 404 additionally.

The first control sub-circuit 401, the second control sub-circuit 402, and the third control sub-circuit 403 are the same as the first control sub-circuit 101, the second control sub-circuit 102, and the third control sub-circuit 103 in the control circuit according to the first embodiment in terms of structure and connection manner, the detailed description thereof is omitted here.

The fourth control sub-circuit 404 may receive a setting signal from the electronic device and control a voltage level of the second control signal according to the setting signal.

Figure 5:
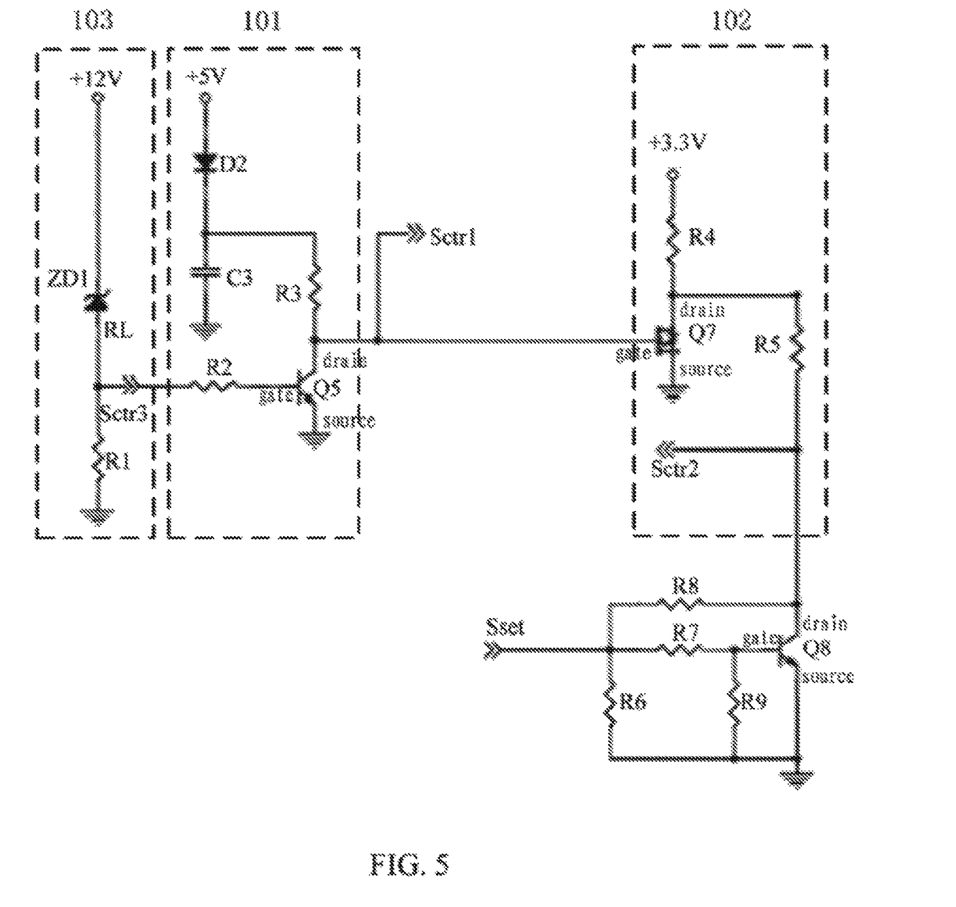
FIG. 5 is a circuit diagram illustrating the control circuit according to the second embodiment of the present application.

Specifically, as shown in FIG. 5, the fourth control sub-circuit 404 comprises a third transistor Q8, a gate of the third transistor Q8 receives the setting signal Sset, a drain of the third transistor Q8 receives the second control signal outputted from the second control sub-circuit 402, and a source of the third transistor Q8 is grounded.

For example, when a mute function of an OSD menu of the electronic device is set to ON, the setting signal Sset is at a high voltage level; and when the mute function is set to OFF, the setting signal Sset is at a low voltage level.

As shown in FIG. 5, when the setting signal Sset is at a low voltage level, the third transistor Q8 is turned off, and the voltage level of the second control signal Sctr2 is the same as the voltage level of the second power supply signal VDD2. On the other hand, when the setting signal Vset is at a high voltage level, the third transistor Q8 is turned on, and the voltage level of the second control signal Sctr2 is a low voltage level.

Figure 6:
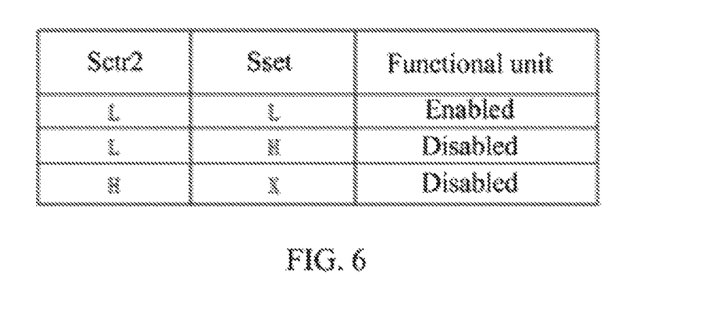
FIG. 6 is a logic diagram illustrating the control circuit according to the second embodiment of the present application.

FIG. 6 is a logic truth diagram illustrating the control circuit according to the second embodiment of the present application.

As shown in FIG. 6, when the second control signal Sctr2 and the setting signal Sset are both at a low voltage level, the functional sub-circuit is enabled.

When the second control signal Sctr2 is at a low voltage level and the setting signal Sset is at a high voltage level, the functional sub-circuit is disabled.

When the second control signal Sctr2 is at a high voltage level, the functional sub-circuit is disabled no matter whether the setting signal Sset is at a high voltage level or a low voltage level.

Therefore, during the power-on and power-off process of the electronic device, if the mute function is set in the OSD menu of the electronic device, since the voltage level of the second control signal Sctr2 for controlling the functional sub-circuit, such as the power amplifier sub-circuit, is kept at a low voltage level, the first functional sub-circuit, such as the power amplifier sub-circuit, is disabled, which can completely avoid the puffing noise problem during the power-on process.

On the other hand, during a normal operation of the electronic device, it is also possible to keep the voltage level of the second control signal Sctr2 for controlling the functional sub-circuit, such as the power amplifier sub-circuit, to be at a low voltage level by setting the mute function in the OSD menu of the electronic device, thereby causing the first functional sub-circuit, such as the power amplifier sub-circuit, to be disabled.

Consequently, the control circuit according to the second embodiment of the present application can control the functional sub-circuit, such as the power amplifier sub-circuit, more flexibly through the additional fourth control sub-circuit, completely avoid the puffing noise problem during the power-on and the power-off process, thereby improve user experience.

Third Embodiment

Hereinafter, a control method according to a third embodiment of the present application will be described with reference to FIG. 7. The control method according to the third embodiment of the present application is applied to the control circuit described in the above embodiments.

Figure 7:
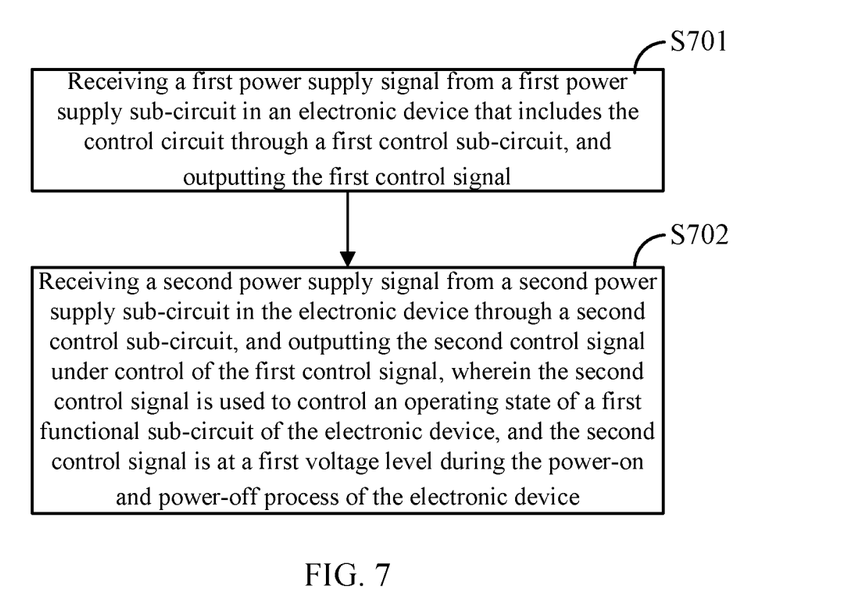
FIG. 7 is a flowchart illustrating a control method according to a third embodiment of the present application.

FIG. 7 is a flowchart illustrating a control method according to a third embodiment of the present application. As shown in FIG. 7, the control method 700 according to the third embodiment of the present application comprises:

Step S701: receiving a first power supply signal from a first power supply sub-circuit in an electronic device that includes the control circuit through a first control sub-circuit, and outputting the first control signal;

Step S702: receiving a second power supply signal from a second power supply sub-circuit in the electronic device through a second control sub-circuit, and outputting the second control signal under control of the first control signal, wherein the second control signal is used to control an operating state of a first functional sub-circuit of the electronic device, and the second control signal is at a first voltage level (e.g., a low voltage level) during the power-on and power-off process of the electronic device.

The control method 700 further comprises:

receiving a third power supply signal from a third power supply sub-circuit in the electronic device through a third control sub-circuit, and outputting the third control signal, wherein the first control sub-circuit outputs the first control signal under control of the third control signal, when the third control signal is at a first voltage level, a voltage level of the first control signal is the same as a voltage level of the first power supply signal; and when the third control signal is at a third voltage level, a voltage level of the first control signal is a first voltage level.

As described above with reference to the control circuit of the first embodiment, since the voltage level of the second control signal Sctr2 for controlling the first functional sub-circuit, such as the power amplifier sub-circuit, is kept at a low voltage level during the power-on period T1 of the electronic device, the first functional sub-circuit, such as the power amplifier sub-circuit, is disabled, which can completely avoid the puffing noise problem during the power-on process.

In addition, during the power-off period T3 of the electronic device, since the voltage level of the second control signal Sctr2 for controlling the first functional sub-circuit, such as the power amplifier sub-circuit, is kept at a low voltage level, the first functional sub-circuit, such as the power amplifier sub-circuit, is disabled, which can completely avoid the puffing noise problem during the power-off process.

Consequently the control method according to the third embodiment of the present application can completely avoid the puffing noise problem during the power-on and power-off process, thereby improve user experience.

Fourth Embodiment

Figure 8:
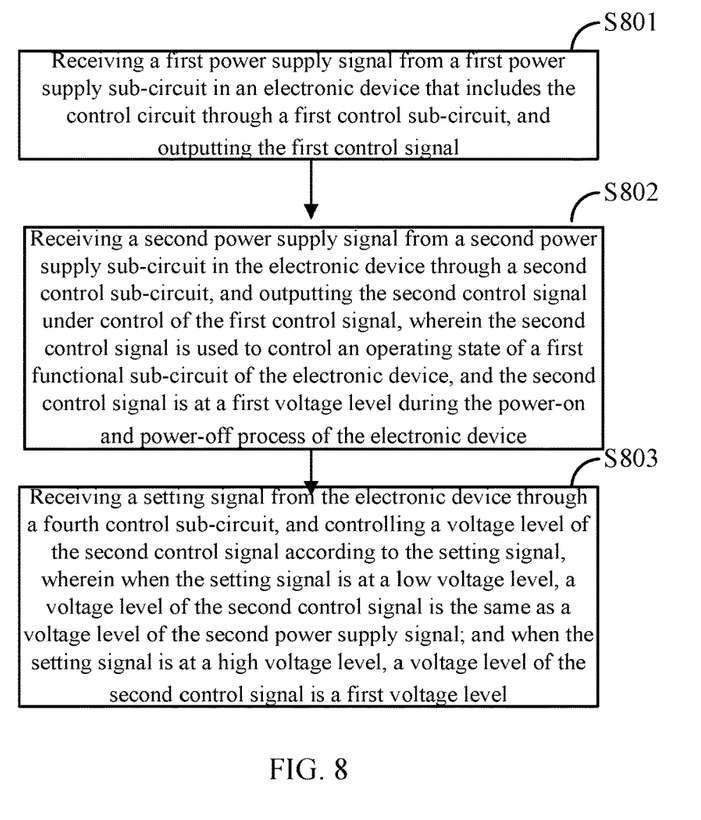
FIG. 8 is a flowchart illustrating a control method according to a fourth embodiment of the present application.

FIG. 8 is a flowchart illustrating a control method according to a fourth embodiment of the present application. As shown in FIG. 8, the control method 800 according to the fourth embodiment of the present application comprises:

Step S801: receiving a first power supply signal from a first power supply sub-circuit in an electronic device that includes the control circuit through a first control sub-circuit, and outputting the first control signal;

Step S802: receiving a second power supply signal from a second power supply sub-circuit in the electronic device through a second control sub-circuit, and outputting the second control signal under control of the first control signal, wherein the second control signal is used to control an operating state of a first functional sub-circuit of the electronic device, and the second control signal is at a first voltage level during the power-on and power-off process of the electronic device; and Step S803: receiving a setting signal from the electronic device through a fourth control sub-circuit, and controlling a voltage level of the second control signal according to the setting signal, wherein when the setting signal is at a low voltage level, a voltage level of the second control signal is the same as a voltage level of the second power supply signal: and when the setting signal is at a high voltage level, a voltage level of the second control signal is a first voltage level.

In comparison to the control method according to the third embodiment, the control method according to the fourth embodiment has a step of receiving a setting signal additionally.

Therefore, during the power-on and power-off process of the electronic device, if the mute function is set in the OSD menu of the electronic device, since the voltage level of the second control signal Sctr2 for controlling the functional sub-circuit, such as the power amplifier sub-circuit, is kept at a low voltage level, the first functional sub-circuit, such as the power amplifier sub-circuit, is disabled, which can completely avoid the puffing noise problem during the power-on process.

On the other hand, during a normal operation of the electronic device, it is also possible to keep the voltage level of the second control signal Sctr2 for controlling the functional sub-circuit, such as the power amplifier sub-circuit, to be at a low voltage level by setting the mute function in the OSD menu of the electronic device, thereby causing the first functional sub-circuit, such as the power amplifier sub-circuit, to be disabled.

Consequently, the control method according to the fourth embodiment of the present application can control the functional sub-circuit, such as the power amplifier sub-circuit, more flexibly through the additional fourth control sub-circuit, completely avoid the puffing noise problem during the power-on and the power-off process, thereby improve user experience.

Fifth Embodiment

Figure 9:
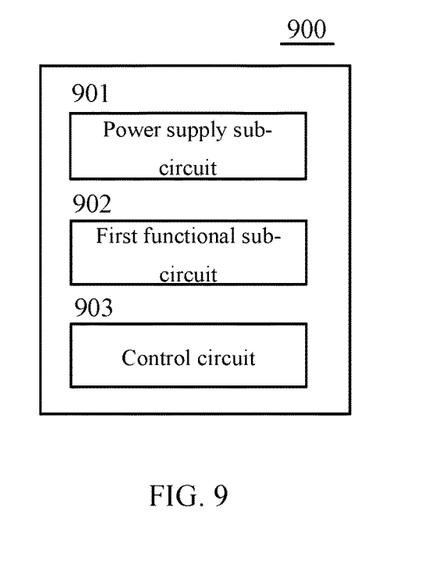
FIG. 9 is a block diagram illustrating configuration of a display device according to a fifth embodiment of the present application.

FIG. 9 is a block diagram illustrating configuration of a display device according to a fifth embodiment of the present application. The electronic device may be any electronic device as long as the electronic device includes a functional sub-circuit, such as the power amplifier sub-circuit. Examples of such electronic device may include display, television, smartphone, tablet PC, and the like.

As shown in FIG. 9, the electronic device 900 comprises:

power supply sub-circuits 901 configured to provide a first power supply signal, a second power supply signal, and a third power supply signal;

a first functional sub-circuit 902 configured to perform a first functional operation; and a control circuit 903.

The control circuit may be the control circuit 100 in the above first embodiment or the control circuit 400 in the above second embodiment. The detailed description thereof will be omitted here.

By setting such control circuit 903 in the electronic device 900, since the voltage level of the second control signal Sctr2 for controlling the first functional sub-circuit 902, such as a power amplifier sub-circuit, is kept at a low voltage level during the T1 period in which the electronic device is powered on, the first functional sub-circuit 902, such as the power amplifier sub-circuit, is disabled, which can completely avoid the puffing noise problem during the power-on process.

In addition, during the power-off period T3 of the electronic device, since the voltage level of the second control signal Sctr2 for controlling the first functional sub-circuit 902, such as a power amplifier sub-circuit, is kept at a low voltage level, the first functional sub-circuit 902, such as the power amplifier sub-circuit, is disabled, which can completely avoid the puffing noise problem during the power-off process.

Consequently, according to the electronic device according to the fifth embodiment of the present application can completely avoid the puffing noise problem during the power-on and power-off process, thereby improve user experience.

It is to be noted that the above embodiments are merely examples, and the present application is not limited to such examples, various changes may be made.

It should be noted that, in the specification, the terms "comprise", "include" and any other variations thereof intend to cover nonexclusive inclusion so that the procedure, the method, the product or the equipment including a series of elements include not only these elements, but also other elements which are not listed explicitly, or also include inherent elements of these procedure, method, product or equipment. In the case that there is no further limitation, elements defined by the expressions "comprise one . . . " do not exclude there being additional identity elements in the procedure, method, product or equipment of the elements.

Finally, it should be noted that, the above-described series of processings do not only comprise processings executed chronologically in the order mentioned here, and also comprise processings executed in parallel or individually but not chronologically.

Through the above description of the implementations, a person skilled in the art can clearly understand that the present application may be implemented in a manner of software plus a necessary hardware platform, and of course the present application may also be implemented fully by hardware. Based on such understanding, the technical solution of the present application that contributes to the background art may be embodied in whole or in part in the form of a software product. The computer software product may be stored in a storage medium, such as ROM/RAM, disk, CD-ROM, and include several instructions for causing a computer apparatus (which may be a personal computer, a server, or a network device) to perform the method described in the various embodiments of the present application or certain parts thereof.

Although the present application has been described in detail in the above, specific examples are applied in this text to demonstrate the principles and implementations of the present application, these descriptions of the above embodiments are only to help understand the method of the present application and its core concept. Meanwhile, for a person with ordinary skill in the art, depending on the concepts of the present application, modifications may be made to the specific implementations and applications. To sum up, contents of this specification should not be construed as limiting the present application.

The present application claims priority of the Chinese Patent Application No. 201610816674.8 filed on Sep. 12, 2016, the entire application of which is hereby incorporated in full text by reference as part of the present application.

What is claimed is:

1. A control circuit for an electronic device, the control circuit comprising:
    a first control sub-circuit configured to receive a first power supply signal from a first power supply sub-circuit in the electronic device and output a first control signal;
    a second control sub-circuit configured to receive a second power supply signal from a second power supply sub-circuit in the electronic device and output a second control signal under control of the first control signal; and
    a third control sub-circuit configured to receive a third power supply signal from a third power supply sub-circuit in the electronic device and output a third control signal,
    wherein the second control signal is used to control a functional sub-circuit in the electronic device to be disabled during power-on and power-off process of the electronic device, and
    wherein the first control sub-circuit comprises a first transistor, a drain of the first transistor is connected to the first power supply sub-circuit to receive the first power supply signal, a gate of the first transistor is connected to the third control sub-circuit to receive the third control signal, a source of the first transistor is grounded, and the first control signal is outputted at the drain of the first transistor.

2. The control circuit according to claim 1, wherein the functional sub-circuit is a power amplifier sub-circuit.

3. The control circuit according to claim 1, wherein the second power supply signal is different from the first power supply signal, and the second power supply signal is obtained by converting the first power supply signal.

4. The control circuit according to claim 1,
    wherein the first control sub-circuit outputs the first control signal under control of the third control signal.

5. The control circuit according to claim 4, wherein the third control sub-circuit comprises a zener diode, a reverse terminal of the zener diode is connected to the third power supply signal and a forward terminal of the zener diode is connected to the gate of the first transistor to output the third control signal.

6. The control circuit according to claim 5, wherein the second control sub-circuit comprises a second transistor, a gate of the second transistor receives the first control signal outputted from the first control sub-circuit, a drain of the second transistor receives the second power supply signal outputted from the second power supply sub-circuit, a source of the second transistor is grounded, and the second control signal is outputted at the drain of the second transistor.

7. The control circuit according to claim 6, further comprising:
    a fourth control sub-circuit configured to receive a setting signal from the electronic device and control a voltage level of the second control signal according to the setting signal.

8. The control circuit according to claim 7, wherein the fourth control sub-circuit comprises a third transistor, a gate of the third transistor receives the setting signal, a drain of the third transistor receives the second control signal outputted from the second control sub-circuit, and a source of the third transistor is grounded.

9. A control method applied to a control circuit as claimed in claim 1, the control method comprising:
    receiving a first power supply signal from a first power supply sub-circuit in an electronic device that includes the control circuit through a first control sub-circuit, and outputting the first control signal;
    receiving a second power supply signal from a second power supply sub-circuit in the electronic device through a second control sub-circuit, and outputting a second control signal under control of the first control signal,
    wherein the second control signal is used to control a functional sub-circuit in the electronic device to be disabled during power-on and power-off process of the electronic device.

10. The control method according to claim 9, further comprising:

receiving a third power supply signal from a third power supply sub-circuit in the electronic device through a third control sub-circuit, and outputting a third control signal, wherein the first control sub-circuit outputs the first control signal under control of the third control signal, when the third control signal is at a first voltage level, a voltage level of the first control signal is the same as a voltage level of the first power supply signal; and when the third control signal is at a third voltage level, a voltage level of the first control signal is a first voltage level.

11. The control method according to claim 10, further comprising:

receiving a setting signal from the electronic device through a fourth control sub-circuit, and controlling a voltage level of the second control signal according to the setting signal, wherein when the setting signal is at a low voltage level, a voltage level of the second control signal is the same as a voltage level of the second power supply signal; and when the setting signal is at a high voltage level, a voltage level of the second control signal is a first voltage level.

12. An electronic device, comprising:

power supply sub-circuits configured to provide a first power supply signal, a second power supply signal, and a third power supply signal;

a functional sub-circuit configured to perform a first functional operation;

a control circuit according to claim 1.

* * * * *